United States Patent
Koizumi

(10) Patent No.: US 7,014,984 B2
(45) Date of Patent: Mar. 21, 2006

(54) POLYMERIZABLE LITHOGRAPHIC PRINTING PLATE PRECURSOR

(75) Inventor: Shigeo Koizumi, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 6 days.

(21) Appl. No.: 11/050,717

(22) Filed: Feb. 7, 2005

(65) Prior Publication Data

US 2005/0175934 A1    Aug. 11, 2005

(30) Foreign Application Priority Data

Feb. 5, 2004    (JP)    ............. P 2004-029372

(51) Int. Cl.
  *G03C 1/85* (2006.01)
  *G03C 1/76* (2006.01)
  *G03F 7/09* (2006.01)
  *G03F 7/20* (2006.01)
  *G03F 7/30* (2006.01)

(52) U.S. Cl. ............ 430/273.1; 430/302; 430/944; 430/945; 430/271.1

(58) Field of Classification Search ............ 430/270.1, 430/271.1, 273.1, 281.1, 287.1, 285.1, 944, 430/945, 302
See application file for complete search history.

(56) References Cited

U.S. PATENT DOCUMENTS 6,706,462 B1 *   3/2004   Murota et al. ........... 430/273.1
2004/0253530 A1 * 12/2004  Serizawa et al. .......... 430/124

FOREIGN PATENT DOCUMENTS

| JP | 61-9621  B2 | 3/1986 |
| JP | 63-178105 A | 7/1988 |
| JP | 2-244050  A | 9/1990 |

* cited by examiner

*Primary Examiner*—Sin Lee
(74) *Attorney, Agent, or Firm*—Sughrue Mion, PLLC

(57) ABSTRACT

A polymerizable lithographic printing plate precursor comprising a support having in order thereon, a polymerizable photosensitive layer and a protective layer containing (A) polyvinyl alcohol and (B) a polyoxyethylene castor oil ether surfactant.

13 Claims, No Drawings

POLYMERIZABLE LITHOGRAPHIC PRINTING PLATE PRECURSOR

FIELD OF THE INVENTION

The present invention relates to a polymerizable lithographic printing plate precursor, and more particularly it relates to a polymerizable lithographic printing plate precursor suitable for a so-called CTP plate making in which radiation, for example, a laser beam is scanned on a surface of a lithographic printing plate precursor to directly form a letter original, an image original and the like on the surface of the lithographic printing plate precursor, thereby performing automatically transport, exposure and direct plate making of the lithographic printing plate precursor without using a film original.

BACKGROUND OF THE INVENTION

Hitherto, photopolymerizable compositions and negative-working lithographic printing plate precursors using the same have been widely known, and various photosensitive layers are also known, In order to conduct plate making of such a lithographic printing plate precursor, a method wherein a transparent negative film original (lith film) is put on the lithographic printing plate precursor and the lithographic printing plate precursor is imagewise exposed using an ultraviolet ray is ordinarily used and thus, the method involves a large amount of time and effort to conduct plate making.

On the other hand, digitized techniques of electronically processing, accumulating and outputting image data using a computer have prevailed in recent years, and various image output systems corresponding to these digitized techniques have been put into practical use. Also, photopolymers having high sensitivity to radiation used for the exposure has been requested. Specifically, photosensitive materials suitable for plate making using, for example, a visible light laser or a near infrared ray laser are desired and a radiation polymerization system is a promising photosensitive material because of the highest sensitivity. As an exposure apparatus for such a system, for example, 488 nm and 514.5 nm rays of an Ar laser, 390 to 410 nm ray of a GaN semiconductor laser, 532 nm ray of a FD-YAG laser or 830 nm ray of a high power semiconductor laser has been practically used.

By using a high-sensitive polymerizable photosensitive layer as a photosensitive layer, a direct plate making is made possible. For instance, the direct plate making can be performed by using photosensitive compositions described in Patent Documents 1 to 3 shown below.

Also, it has been ordinarily conducted to provide a protective layer comprising a water-soluble resin on the photosensitive layer in order to protect the photosensitive layer from stain and dust and to prevent a monomer component conventionally used in the photosensitive layer from being deactivated due to reaction with oxygen in air. However, in the case of using the laser exposure apparatus described above, since plate making is conducted using the laser exposure apparatus having an automatic transport mechanism, problems occur in that an inter leaf, which is interleaved between the lithographic printing plate precursors for the purpose of protecting the surface of the lithographic printing plate precursor, adheres on the surface of protective layer of the lithographic printing plate precursor or friction coefficient of the surface of protective layer increases even though the adhesion doesn't occur and thus the transport and removal of the inter leaf becomes impossible or the transport of the lithographic printing plate precursor becomes impossible in the step of transport of the lithographic printing plate precursor and the inter leaf and in the step of removal of the inter leaf, when environmental humidity is high. Alternatively, even though the transport of the lithographic printing plate precursor can be conducted, the surface of the protective layer is scratched to cause failure in the image formed in some cases.

Patent Document 1: JP-B-61-9621 (the term "JP-B" as used herein means an "examined Japanese patent publication")

Patent Document 2: JP-A-63-178105 (the term "JP-A" as used herein means an "unexamined published Japanese patent application")

Patent Document 3: JP-A-2-244050

SUMMARY OF THE INVENTION

An object of the present invention is to overcome the problems in the prior art and to provide a polymerizable lithographic printing plate precursor, which is capable of being subjected to automatic transport even when environmental temperature and humidity are relatively high at the transport and exhibits a small change in the friction coefficient of the surface of protective layer depending on the environmental temperature and humidity. Another object of the invention is to provide a polymerizable lithographic printing plate precursor, which has strong adhesion between a photosensitive layer and a protective layer, which is hardly scratched when the friction coefficient of the surface of protective layer somewhat increases, that is, which is excellent in scratch resistance, which has high sensitivity, and which has a good balance among ink receptivity, printing durability, preservation stability and the like.

As a result of intensive investigations to achieve the above-described objects, the inventor has found that the above-described objects can be achieved by a polymerizable lithographic printing plate precursor having a protective layer comprising specific components to complete the invention.

Specifically, the present invention includes a polymerizable lithographic printing plate precursor comprising a support having in order thereon, a polymerizable photosensitive layer and a protective layer containing (A) polyvinyl alcohol and (B) a polyoxyethylene castor oil ether surfactant.

DETAILED DESCRIPTION OF THE INVENTION

According to the invention, by incorporating (A) polyvinyl alcohol and (B) a polyoxyethylene castor oil ether surfactant into a protective layer, a polymerizable lithographic printing plate precursor, which is capable of being subjected to automatic transport even when environmental temperature and humidity are relatively high at the exposure transport, which exhibits a small change in the friction coefficient of the surface of protective layer depending on the environmental temperature and humidity, which has strong adhesion between a photosensitive layer and a protective layer, which is hardly scratched when the friction coefficient of the surface of protective layer somewhat increases, that is, which is excellent in scratch resistance, which has high sensitivity, and which has a good balance among ink receptivity, printing durability, preservation stability and the like, can be provided.

The polymerizable lithographic printing plate precursor according to the present invention will be described in more detail below.

[Protective Layer]

First, the protective layer provided on the polymerizable photosensitive layer, which is the feature of the invention, is described below. The protective layer according to the invention is provided as an oxygen barrier layer in order to prevent the polymerizable photosensitive layer from a polymerization inhibiting function of oxygen. The protective layer according to the invention is characterized by containing at least (A) polyvinyl alcohol and (B) a polyoxyethylene castor oil ether surfactant.

The polyvinyl alcohol of component (A) includes, for example, polyvinyl alcohol, a partial ester, ether and acetal of polyvinyl alcohol (these are also collectively referred to as a polyvinyl alcohol derivative sometimes) and a copolymer of polyvinyl alcohol containing a substantial amount of unsubstituted vinyl alcohol unit sufficient for imparting the desired solubility in water and other copolymerizable monomer unit, for example, itanonic acid. As the polyvinyl alcohols, those having a hydrolysis rate of from 71 to 100% and a polymerization degree of from 300 to 2,400 are exemplified. Specific examples of the polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 manufactured by Kuraray Co., Ltd. Examples of the copolymer include polyvinyl acetate, polyvinyl chloroacetate, polyvinyl propionate, polyvinyl formal, polyvinyl acetal and a copolymer thereof each having the hydrolysis ratio of from 71 to 100%, polyvinyl alcohol cation-modified with a quaternary ammonium salt and polyvinyl alcohol anion-modified with a sodium sulfonate.

An amount of the polyvinyl alcohol added is preferably from 50 to 98% by weight based on the total solid content of the protective layer.

Now, the polyoxyethylene castor oil ether surfactant of component (B) is described below. The castor oil is a vegetal nondrying oil obtained by a press method from seed of castor-oil plant. The seed of castor-oil plant contains from 35 to 57% of castor oil. The component of the castor oil includes about 85% of ricinoleic acid, which is an unsaturated carboxylic acid. The ricinoleic acid is a derivative of stearic acid, which has a carboxy group at a terminal, a hydroxy group at 12-position and an unsaturated double bong at 9-position. The polyoxyethylene castor oil ether surfactant is a generic term of nonionic surfactants synthesized by addition of ethylene oxide to ricinoleic acid, which is the main component of the castor oil. Depending on conditions during the addition reaction, the hydroxy group and the carboxylic acid group of ricinoleic acid are reacted between the molecules to from a polyester, whereby a surfactant containing a polymer having a molecular weight of from 10,000 to 20,000 can also be formed.

The polyoxyethylene castor oil ether surfactant also includes a surfactant formed by addition of ethylene oxide to glycerol of ricinoleic acid.

The polyoxyethylene castor oil ether surfactant suitably used in the invention has a hydrophilic-lipophilic balance (HLB value) of preferably from 10.0 to 16.0, more preferably from 11.0 to 15.0. A weight average molecular weight of the polyoxyethylene castor oil ether surfactant is ordinarily from 800 to 5,000, preferably from 1,000 to 3,000. When the weight average molecular weight is 800 or more, the effect for reducing friction coefficient increases, and when the weight average molecular weight is 5,000 or less, decrease in solubility is prevented.

Specific examples of the polyoxyethylene castor oil ether surfactant include Pionin D-225, Pionin D-240-W, Pionin D-230, Pionin D-236 and Pionin D-225-K manufactured by Takemoto Oil & Fat Co., Ltd., and Emanon CH-25, Emanon CH-40 and Emanon CH-60 manufactured by Kao Corp.

An amount of the polyoxyethylene castor oil ether surfactant added is ordinarily from 1.0 to 10% by weight, preferably from 2.0 to 6.0% by weight, based on the total solid content of the protective layer. When the amount added is 1.0% by weight or more, the effect for reducing friction coefficient increases, and when the amount added is 10% by weight or less, coating property of the protective layer is improved and the occurrence of coating unevenness can be prevented.

Further, when the protective layer of the invention has critical surface tension γc determined by a method described in H. W. Fox and W. A. Zisman, *J. Colloid Sci.*, 5514 (1950) of 15 dyn/cm or less, it is preferred since it exhibits high adhesion to the polymerizable photosensitive layer, which particularly results in increase in scratch resistance of the polymerizable photosensitive layer.

It is preferred that a known additive, for example, a surfactant for improving the coating property or a water-soluble polymer other than polyvinyl alcohol for improving physical properties of coating film is added to the protective layer according to the invention.

Examples of the surfactant for improving the coating property, which can be used, include nonionic surfactants, for example, polyoxyethylene alkyl ether (e.g., polyoxyethylene lauryl ether, polyoxyethylene cetyl ether or polyoxyethylene stearyl ether), polyoxyethylene alkyl aryl ether (e.g., polyoxyethylene octyl phenyl ether or polyoxyethylene nonyl phenyl ether), polyoxyethylene alkyl ester (e.g., polyoxyethylene stearate), sorbitan alkylester (e.g., sorbitan monolaurate, sorbitan monostearate, sorbitan distearate, sorbitan monooleate, sorbitan sesquioleate or sorbitan trioleate) and monoglyceride alkyl ester (e.g., glycerol monostearate or glycerol monooleate); anionic surfactants, for example, alkylbenzenesulfonate (e.g., sodium dodecylbenzenesulfonate), alkylnaphthalenesulfonate (e.g., sodium butylnaphthalenesulfonate, sodium pentylnaphthalenesulfonate, sodium hexylnaphthalenesulfonate or sodium octylnaphthalenesulfonate), alkylsulfate (e.g., sodium laurylsulfate), alkylsulfonate (e.g., sodium dodecylsulfonate) and sulfosuccinic acid ester salt (e.g., sodium dilaurylsulfosuccinate); and amphoteric surfactants, for example, alkyl betaine (e.g., lauryl betaine or stearyl betaine) and amino acid. Of the surfactants, anionic surfactants, for example, alkylnaphthalenesulfonates, alkyl betaines and nonionic surfactants having a polyoxyalkylene ether group represented by formula (1) shown below are particularly preferably used.

$$R^1\text{—O—}(R^2\text{—O})_n H \tag{1}$$

In formula (1), $R^1$ represents an alkyl group having from 3 to 15 carbon atoms, which may have a substituent, an aromatic hydrocarbon group having from 6 to 15 carbon atoms, which may have a substituent, or a heteroaromatic ring group having from 4 to 15 carbon atoms, which may have a substituent (examples of the substituent including an alkyl group having from 1 to 20 carbon atoms, a halogen atom, e.g., Br, Cl or I, an aromatic hydrocarbon group having from 6 to 15 carbon atoms, an aralkyl group having from 7 to 17 carbon atoms, an alkoxy group having from 1 to 20 carbon atoms, an alkoxycarbonyl group having from 2 to 20 carbon atoms and an acyl group having from 2 to 15 carbon atoms); $R^2$ represents an alkylene group having from 1 to 10 carbon atoms, which may have a substituent (examples of the substituent including an alkyl group having from 1 to 20 carbon atoms and an aromatic hydrocarbon group having from 6 to 15 carbon atoms); and n represents an integer of from 1 to 100. The part represented by $(R^2—O)n$ in formula (1) may be formed from two-kind groups or three-kind groups as far as they fulfill the above-described requirements. Specific examples thereof include random or block combinations of ethylene oxy group and propylene oxy group, ethylene oxy group and isopropylene oxy group, ethylene oxy group and butylene oxy group, and ethylene oxy group and isobutylene oxy group.

More specifically, a compound represented by formula (2) shown below is preferably used as the surfactant.

(2)

In formula (2), n represents an integer of from 5 to 25, and m represents an integer of from 3 to 40.

Preferred examples of the compound having the formula represented by formula (2) include commercially available products, for example, NIKKOL BL-9EX (n=12, m=9), MYL-10 (n=11, m=10) and BC15-TX (n=16, m=15) manufactured by Nikko Chemicals Co., Ltd., and Emalex 710 (n=12, m=10) manufactured by Nihon-Emulsion Co., Ltd.

An amount of the surfactant added is preferably from 0.2 to 8% by weight, more preferably from 0.5 to 5% by weight, most preferably from 1 to 3% by weight, based on the total solid content of the protective layer.

The surfactants may be used individually or in combination.

Specific preferred examples of the water-soluble polymer other than polyvinyl alcohol for improving physical properties of coating film include polyvinyl pyrrolidone and a water-soluble vinyl pyrrolidone copolymer containing 40% by mole or more of vinyl pyrrolidone and having a weight average molecular weight of from 10,000 to 500,000 described in JP-A-2002-169272. An amount of the polyvinyl pyrrolidone or water-soluble vinyl pyrrolidone copolymer added is preferably from 1 to 30% by weight, more preferably from 4 to 20% by weight, based on the total solid content of the protective layer.

The protective layer according to the invention is provided on the polymerizable photosensitive layer and coating is exemplified for providing the protective layer. In the case of coating, a solvent is ordinarily employed. As the solvent used for the coating, although pure water is preferably used, a mixture of an alcohol, for example, methanol or ethanol, or a ketone, for example, acetone or methyl ethyl ketone, with pure water may also be used. The concentration of the solid content in the coating solution is preferably from 1 to 20% by weight.

A coating amount of the protective layer after drying is preferably in a range of from about 0.1 to about 15 $g/m^2$, more preferably from 1.0 to about 5.0 $g/m^2$.

[Polymerizable Photosensitive Layer]

Now, the polymerizable photosensitive layer, which constitutes the polymerizable lithographic printing plate precursor of the invention, is described below. The polymerizable photosensitive layer preferably comprises a polymerizable photosensitive layer composition containing the following components i) to iii):

i) a compound having at least one addition-polymerizable ethylenically unsaturated bond;

ii) a photopolymerization initiator; and iii) a polymer binder.

[Compound Having Addition-Polymerizable Ethylenically Unsaturated Bond]

The compound having an addition-polymerizable ethylenically unsaturated bond, which is contained in the polymerizable photosensitive layer according to the invention, can be appropriately selected from compounds having as a photopolymerization terminal, at least one ethylenically unsaturated double bond group, preferably two or more ethylenically unsaturated double bond groups. Examples of the compound include a compound having the chemical form of a monomer, a prepolymer such as a dimer, a trimer or an oligomer, a mixture thereof and a copolymer thereof. Examples of the monomer include an ester of an unsaturated carboxylic acid (for example, acrylic acid, methacrylic acid, itaconic acid, crotonic acid, isocrotonic acid or maleic acid) with an aliphatic polyhydric alcohol compound and an amide of an unsaturated carboxylic acid with an aliphatic polyvalent amine compound.

Specific examples of the monomer of ester of an unsaturated carboxylic acid with an aliphatic polyhydric alcohol compound include an acrylic acid ester, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate or polyester acrylate oligomer;

a methacrylic acid ester, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate dipentaerythritol pentamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)phenyl]dimethylmethane;

an itaconic acid ester, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate;

a crotonic acid ester, for example, ethylene glycol dicrotonate, tetramethylene glycol dicrotonate, pentaerythritol dicrotonate or sorbitol tetracrotonate;

an isocrotonic acid ester, for example, ethylene glycol diisocrotonate, pentaerythritol diisocrotonate or sorbitol tetraisocrotonate; and a maleic acid ester, for example, ethylene glycol dimaleate, triethylene glycol dimaleate, pentaerythritol dimaleate or sorbitol tetramaleate. Furthermore, mixtures of the above-described ester monomers are exemplified.

Specific examples of the monomer of amide of an unsaturated carboxylic acid with an aliphatic polyvalent amine compound include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Other examples of the compound include a vinyl urethane compound having at least two polymerizable vinyl groups in the molecule thereof obtained by subjecting addition of a vinyl monomer having a hydroxy group represented by formula (A) shown below to a polyisocyanate compound having at least two isocyanato groups in the molecule thereof as described in JP-B-48-41708.

$$CH_2=C(Q^1)COOCH_2CH(Q^2)OH \quad (A)$$

wherein $Q^1$ and $Q^2$ each independently represents a hydrogen atom or a methyl group.

Also, examples of the compound include urethane acrylates as described in JP-A-51-37193, polyfunctional acrylates or methacrylates, for example, a polyester acrylate or a epoxy acrylate obtained by reacting an epoxy resin with (meth)acrylic acid as described in JP-A-48-64183, JP-B-49-43191 and JP-B-52-30490. Further, photocurable monomers and oligomers as described in Nippon Secchaku Kyokaishi, Vol. 20, No. 7, pages 300 to 308 (1984) are also employed.

Specific examples thereof include NK Oligo U-4HA, U-4H, U-6HA, U-108A, U-1084A, U-200AX, U-122A, U-340A, U-324A and UA-100 manufactured by Shin-Nakamura Chemical Co., Ltd., UA-306H, AI-600, UA-101T, UA-101I, UA-306T and UA-306I manufactured by Kyoeisha Chemical Co., Ltd. and Art Resin UN-9200A, UN-3320HA, UN-3320HB, UN-3320HC, SH-380G, SH-500 and SH-9832 manufactured by Negami Chemical Industrial Co., Ltd.

The compound having an addition-polymerizable ethylenically unsaturated double bond is preferably used in an amount of from 5 to 90% by weight, more preferably from 10 to 80% by weight, based on the total components of the photopolymerizable photosensitive layer.

[Photopolymerization Initiator]

Now, the photopolymerization initiator, which is contained in the polymerizable photosensitive layer according to the invention, is described below. The photopolymerization initiator contained in the polymerizable photosensitive layer of the polymerizable lithographic printing plate precursor of the invention can be appropriately selected from various kinds of known photopolymerization initiators or combination systems of two or more photopolymerization initiators (photopolymerization initiation system) described in patents and literature depending on a wavelength of light source to be used. In the invention, the photopolymerization initiator individually used and the combination system of two or more photopolymerization initiators are also collectively referred to as a photopolymerization initiator or a photo-initiator. For instance, in the case of using light having a wavelength of around 400 nm as the light source, benzyl, benzoyl ether, Michler's ketone, anthraquinone, thioxantone, acridine, phenazine, benzophenone and the like are broadly used.

In case of using visible light having a wavelength of 400 nm or more, an Ar laser, a second harmonic of a semiconductor laser or an SHG-YAG laser as the light source, various photo-initiators have been proposed. For instance, a certain kind of photo-reducing dyes, for example, Rose Bengal, Eosin or erythrosine, as described in U.S. Pat. No. 2,850,445, and a combination system comprising a dye and a photo-initiator, for example, a composite initiator system comprising a dye and an amine as described in JP-B-44-20189, a combination system of a hexaarylbiimidazole, a radical generator and a dye as described in JP-B-45-37377, a combination system of a hexaarylbiimidazole and a p-dialkylaminobenzylidene kotone as described in JP-B-47-2528 and JP-A-54-155292, a combination system of a cyclic cis-α-dicarbonyl compound and a dye as described in JP-A-48-84183, a combination system of a cyclic triazine and a merocyanine dye as described in JP-A-54-151024, a combination system of a 3-ketocoumarin and an activator as described in JP-A-52-112681 and JP-A-58-15503, a combination system of a biimidazole, a styrene derivative and a thiol as described in JP-A-59-140203, a combination system of an organic peroxide and a dye as described in JP-A-59-1504, JP-A-59-140203, JP-A-59-189340, JP-A-62-174203, JP-B-62-1641 and U.S. Pat. No. 4,766,055, a combination system of a dye and an active halogen compound as described in JP-A-63-178105, JP-A-63-258903 and JP-A-2-63054, a combination system of a dye and a borate compound as described in JP-A-62-143044, JP-A-62-150242, JP-A-64-13140, JP-A-64-13141, JP-A-64-13142, JP-A-64-13143, JP-A-64-13144, JP-A-64- 17048, JP-A-1-229003, JP-A-1-298348 and JP-A-1-138204, a combination system of a dye having a rhodanine ring and a radical generator as described in JP-A-2-179643 and JP-A-2-244050, a combination system of a titanocene and a 3-ketocoumarin dye as described in JP-A-63-221110, a combination system of a titanocene, a xanthene dye and an addition-polymerizable ethylenically unsaturated compound having an amino group or a urethane group as described in JP-A-4-221958 and JP-A-4-219756, a combination system of a titanocene and a specific merocyanine dye as described in JP-A-6-295061, and a combination system of a titanocene and a dye having a benzopyran ring as described in JP-A-8-334897 are exemplified.

Preferred photo-initiators include combinations wherein cyanine dyes, merocyanine dyes, xanthene dyes, ketocoumarin dyes or benzopyran dyes as dyes and titanocene compounds or triazine compounds as initiators are used. Preferred examples of the cyanine dye include those having a structure represented by the formula shown below, but the invention should not be construed as being particularly limited thereto,

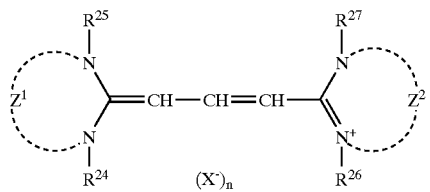

In the formula, $Z^1$ and $Z^2$, which may be the same or different, each represents a non-metallic atomic group necessary for forming a benzimidazole or naphthimidazole ring; $R^{24}$, $R^{25}$, $R^{26}$ and $R^{27}$ each represents an alkyl group, which may be substituted; $X^-$ represents a counter anion; and n represents 0 or 1.

Specific examples of the cyanine dye are set forth below.

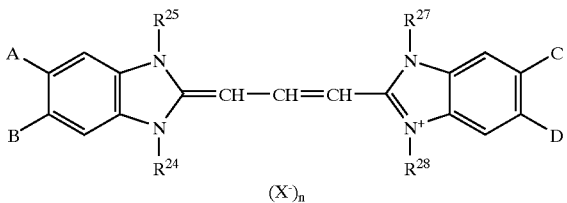

| $R^{24}$ | $R^{25}$ | $R^{26}$ | $R^{27}$ | A | B | C | D | $X^-$ | n |
|---|---|---|---|---|---|---|---|---|---|
| $C_2H_5$ | $C_2H_5$ | $C_2H_5$ | $C_2H_5$ | Cl | Cl | Cl | Cl | $I^-$ | 1 |
| $C_2H_5$ | $C_2H_5$ | $C_2H_5$ | $C_2H_5$ | H | $CF_3$ | H | $CF_3$ | $I^-$ | 1 |
| $(CH_2)_2SO_3Na$ | $C_2H_5$ | $(CH_2)_2SO_3^-$ | $C_2H_5$ | Cl | Cl | Cl | Cl | — | 0 |

Preferred examples of the merocyanine dye include those having a structure represented by the formulae shown below, but the invention should not be construed as being particularly limited thereto.

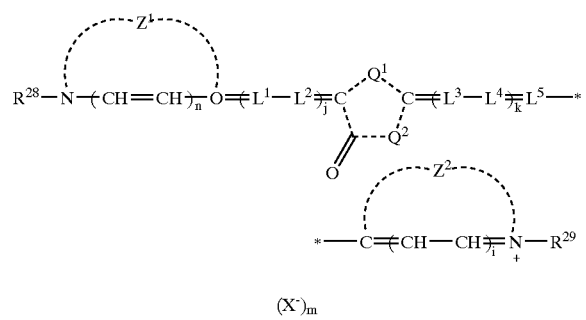

In formula, $Z^1$ and $Z^2$ each represents a non-metallic atomic group necessary for forming a 5-membered or 6-membered nitrogen-containing heterocyclic ring conventionally used in a cyanine dye; $R^{28}$ and $R^{29}$ each represents an alkyl group; $Q^1$ and $Q^2$ each represents an atomic group necessary for forming a 4-thiazolidinone ring, a 5-thiazolidinone ring, a 4-imidazolidinone ring, a 4-oxazolidinone ring, 5-oxazolidinone ring, a 5-imidazolidinone ring or a 4-dithiolanone ring in combination; $L^1$, $L^2$, $L^3$, $L^4$ and $L^5$ each represents a methine group; m represents 1 or 2; i and h each represents 0 or 1; l represents 1 or 2; j and k each represents 0, 1, 2 or 3; and $X^-$ represents a counter anion.

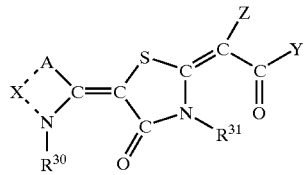

In formula, $R^{30}$ and $R^{31}$ each independently represents a hydrogen atom, an alkyl group, a substituted alkyl group, an alkenyl group, a substituted alkenyl group, an alkynyl group, a substituted alkynyl group, an alkoxycarbonyl group, an aryl group, a substituted aryl group or an aralkyl group; A represents an oxygen atom, a sulfur atom, a selenium atom, a tellurium atom, a nitrogen atom substituted with an alkyl group or an aryl group or a carbon atom substituted with two alkyl groups; X represents a non-metallic atomic group necessary for forming a nitrogen-containing heterocyclic 5-membered ring; Y represents a substituted phenyl group, an unsubstituted or substituted multinuclear aromatic ring or an unsubstituted or substituted heteroaromatic ring; and Z represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group, or Z and Y may be combined with each other to form a ring.

Specific examples of the merocyanine dye are set forth below.

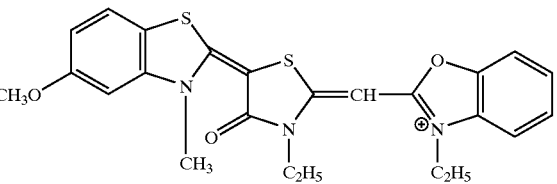

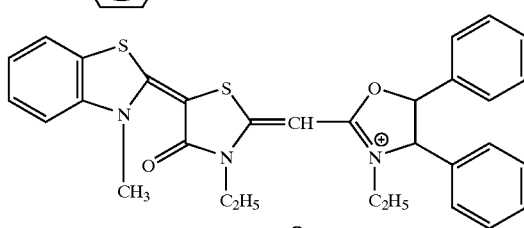

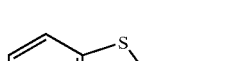

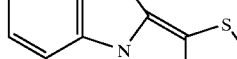

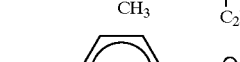

-continued

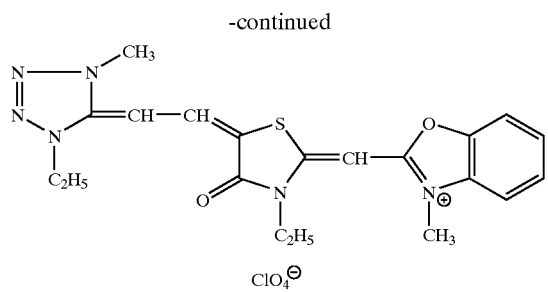

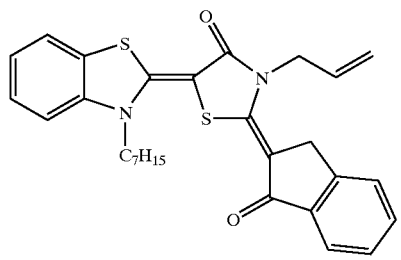

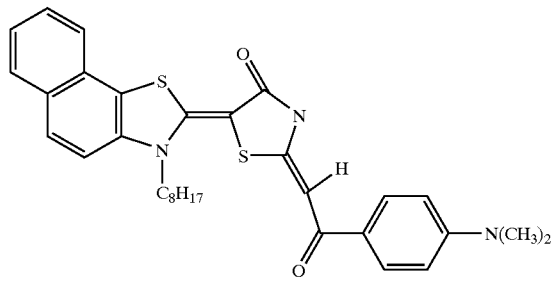

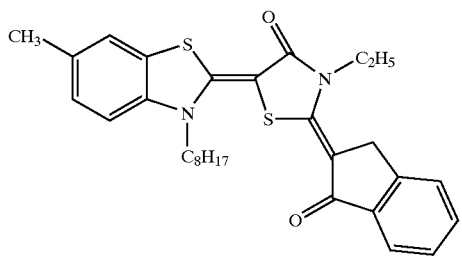

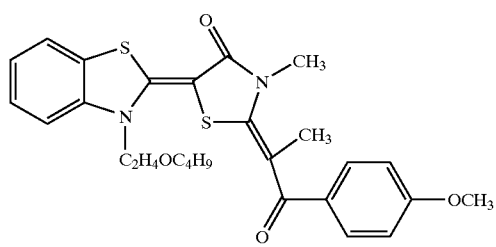

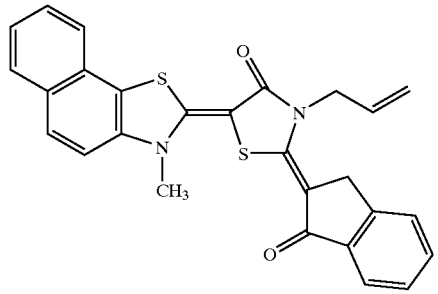

-continued

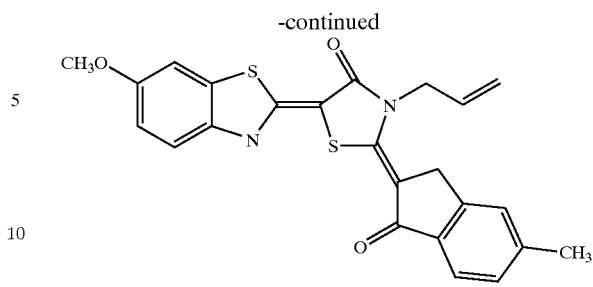

Examples of the xanthene dye include Rhodamine B, Rhodamine 6G, Ethyl Eosin, alcohol-soluble eosin, Pyronin Y and Pyronin B.

Preferred examples of the ketocoumarin dye include those having a structure represented by the formula shown below, but the invention should not be construed as being particularly limited thereto.

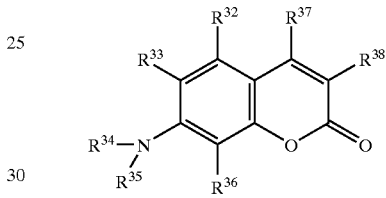

In formula, $R^{32}$, $R^{33}$ and $R^{34}$ each represents a hydrogen atom, a halogen atom, an alkyl group or an alkoxy group; $R^{35}$ and $R^{36}$ each represents an alkyl group, provided that at least one of $R^{35}$ and $R^{36}$ represents an alkyl group having from 4 to 16 carbon atoms; $R^{37}$ represents a hydrogen atom, an alkyl group, an alkoxy group, an acyl group, a cyano group, a carboxy group or a group of an ester derivative or amido derivative thereof; $R^{38}$ represents a heterocyclic residue-CO—$R^{39}$ having the total number of carbon atoms of from 3 to 17 (wherein $R^{39}$ represents a group shown below); or $R^{33}$ and $R^{34}$ or $R^{35}$ and $R^{36}$ may be combined with each other to form a ring.

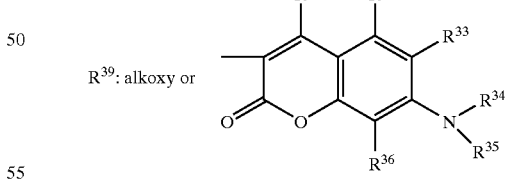

Specific examples of the ketocoumarin dye are set forth below.

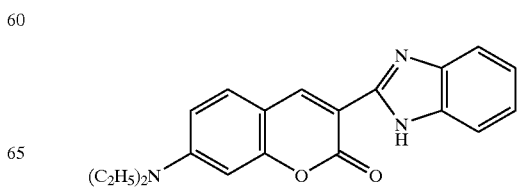

-continued

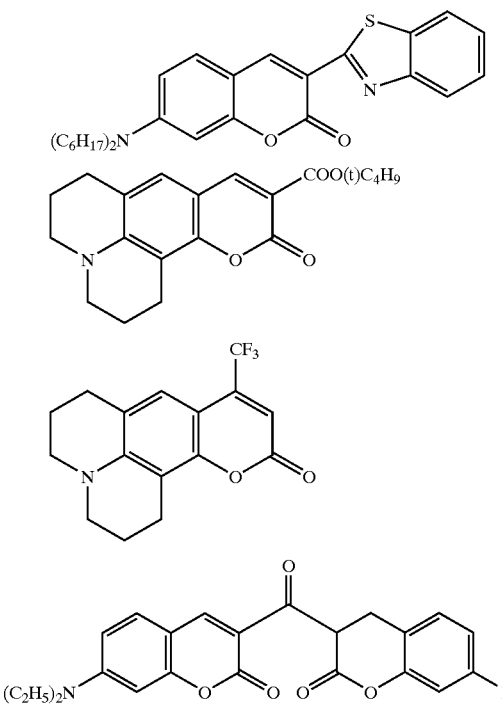

Preferred examples of the benzopyran dye include those having a structure represented by the formula shown below, but the invention should not be construed as being particularly limited thereto.

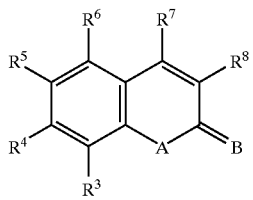

In formula, $R^3$ to $R^6$ each independently represents a hydrogen atom, a halogen atom, an alkyl group, an aryl group, a hydroxy group, an alkoxy group or an amino group, or $R^3$ to $R^6$ may be combined with each other to form a ring composed of non-metallic atoms; $R^7$ represents a hydrogen atom, an alkyl group, an aryl group, a heteroaromatic group, a cyano group, an alkoxy group, a carboxy group or an alkenyl group; $R^5$ represents any one of the groups defined for $R^7$ or -Z-$R^7$ (wherein Z represents a carbonyl group, a sulfonyl group, a sulfinyl group or an arylenedicarbonyl group, or $R^7$ and $R^8$ may be combined with each other to form a ring composed of non-metallic atoms; A represents an oxygen atom, a sulfur atom, NH or a nitrogen atom having a substituent; B represents a group represented by the following formula:

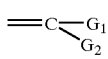

wherein $G^1$ and $G^2$, which may be the same or different, each represents a hydrogen atom, a cyano group, an alkoxycarbonyl group, an aryloxycarbonyl group, an acyl group, an arylcarbonyl group, an alkylthio group, an arylthio group, an alkylsulfonyl group, an arylsulfonyl group or a fluorosulfonyl group, provided that both $G^1$ and $G^2$ do not represent hydrogen atoms at the same time, or $G^1$ and $G^2$ may be combined with each other to form a ring composed of non-metallic atoms together with the carbon atom.

Specific examples of the benzopyran dye are set forth below.

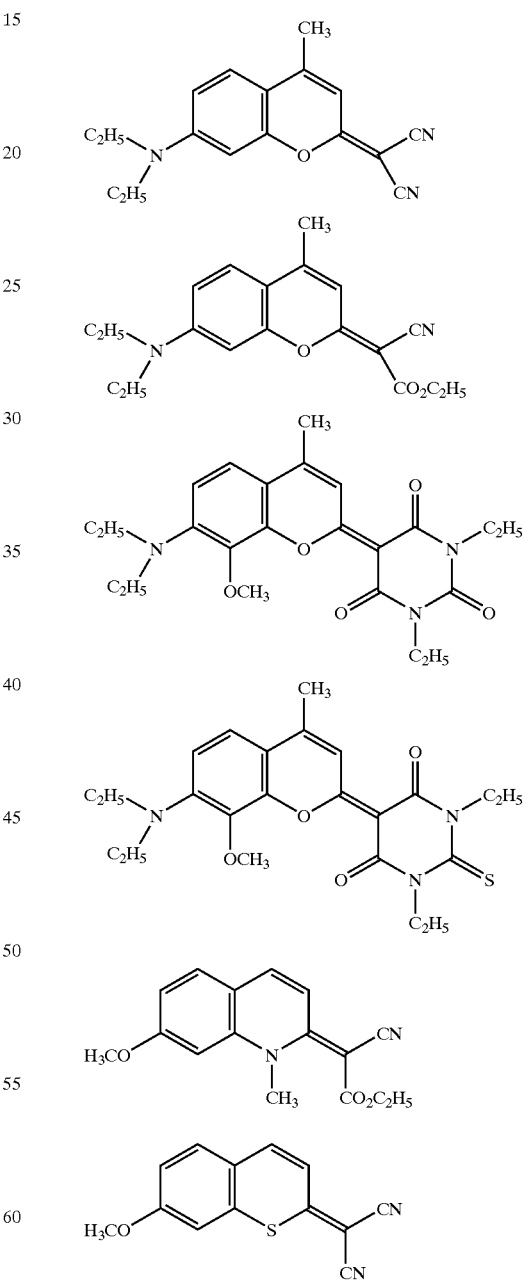

The triazine compound as the photopolymerization initiator include compounds having a structure represented by the following formula:

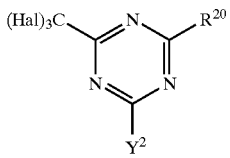

In formula, Hal represents a halogen atom; $Y^2$ represents —$C(Hal)_3$, —$NH_2$, —$NHR^{21}$, —$N(R^{21})_2$ or —$OR^{21}$, wherein $R^{21}$ represents an alkyl group, a substituted alkyl group, an aryl group or a substituted aryl group; and $R^{20}$ represents —$C(Hal)_3$, an alkyl group, a substituted alkyl group, an aryl group, a substituted aryl group, an alkenyl group or a substituted alkenyl group.

Specific examples of the triazine compound are set forth below.

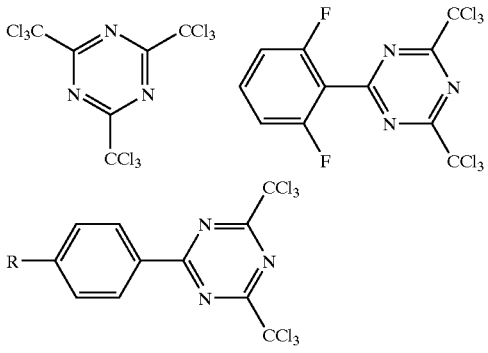

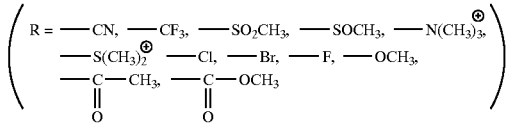

Further, preferred examples of the photopolymerization initiator include titanocene compounds. The titanocene compound can be used by appropriately selecting from known compounds as described in JP-A-59-152396 and JP-A-61-151197.

Specific examples thereof include dicyclopentadienyl-Ti-dichloride, dicyclopentadienyl-Ti-bisphenyl, dicyclopentadienyl-Ti-bis-2,3,4,5,6-pentafluorophen-1-yl (hereinafter referred to as A-1), dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl (hereinafter referred to as A-2), dimethylcyclopentadienyl-Ti-bis-2,3,5,6-tetrafluorophen-1-yl, dimethylcyclopentadienyl-Ti-bis-2,4-difluorophen-1-yl and bis(cyclopentadienyl)-bis(2,6-difluoro-3-(pyr-1-lyl)phenyl titanium (hereinafter referred to as A-3).

The content of the photopolymerization initiator used in the polymerizable photosensitive layer of the polymerizable lithographic printing plate precursor of the invention is preferably in a range of from 0.01 to 70% by weight based on the total amount of the component of polymer binder and the component of compound having an addition-polymerizable ethylenically unsaturated bond. More preferably, favorable results are obtained in a range of from 1 to 50% by weight.

Further, an auxiliary agent, for example, an amine compound or a thiol compound, is added to the photo-initiator. Particularly preferred examples of the auxiliary agent include amine compounds represented by formulae shown below and amino acids.

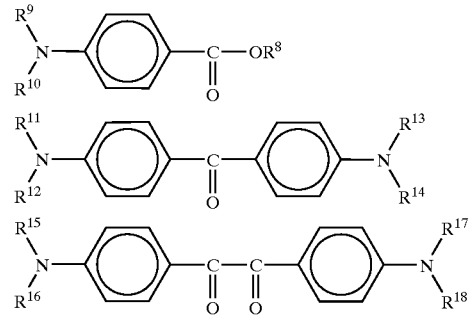

In formula, $R^8$ to $R^{18}$ each represents an alkyl group

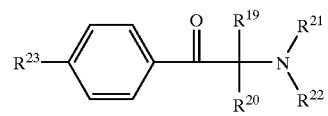

In formula, $R^{19}$ to $R^{22}$ each represents an alkyl group or an alkoxy group, or $R^{21}$ and $R^{22}$ may be combined with each other to from a ring; and $R^{23}$ represents a heterocyclic group or an alkylthio group.

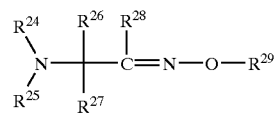

In formula, $R^{28}$ and $R^{29}$, which may be the same or different, each represents a hydrocarbon group, which may have a substituent and contain an unsaturated bond, or a heterocyclic group; $R^{26}$ and $R^{27}$, which may be the same or different, each represents a hydrogen atom, a hydrocarbon group, which may have a substituent and contain an unsaturated bond, a heterocyclic group, a hydroxy group, a substituted oxy group, a mercapto group or a substituted thio group, or $R^{26}$ and $R^{27}$ may be combined with each other to represent an alkylene group having from 2 to 8 carbon atoms thereby forming a ring and the alkylene group may contain —O—, —$NR^{24}$, —O—CO—, —NH—CO—, —S— and/or —$SO_2$— in the main chain thereof; and $R^{24}$ and $R^{25}$ each represents a hydrogen atom or a hydrocarbon group, which may have a substituent or may contain an unsaturated bond.

Moreover, a dialkylamiobenzoic acid ester, for example, ethyl p-diethylaminobenzoate, a bisaminobenzophenone, for example, 4,4'-bis(dimethylamino)benzophenone, biaminobenzyl, for example, 4,4'-bis(diethylamino)benzyl,

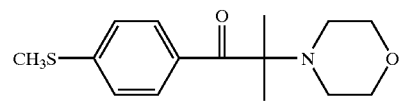

-continued

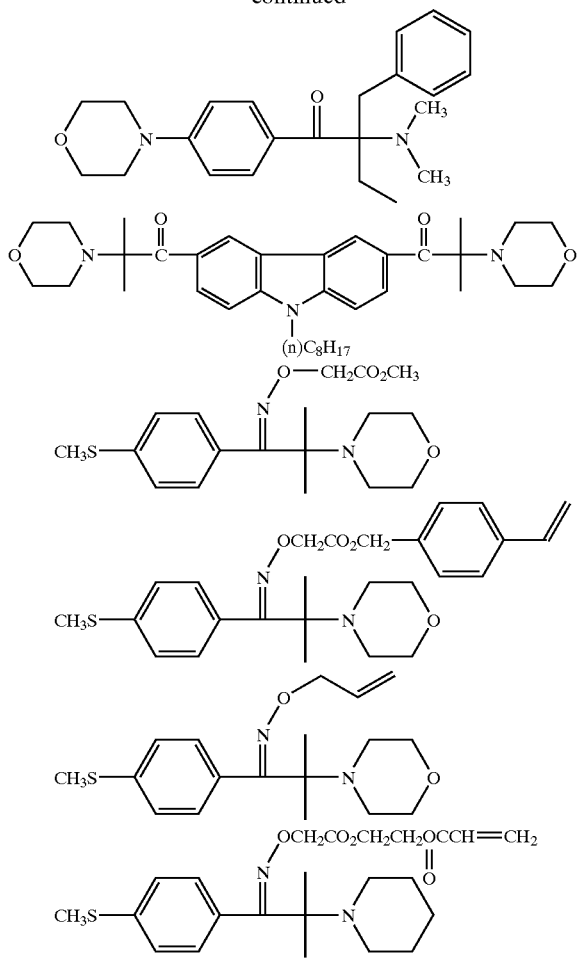

N-phenyl glycine, and sodium salt of N-phenyl glycine are exemplified.

[Polymer Binder]

Now, the polymer binder, which is contained in the polymerizable photosensitive layer according to the invention, is described below.

The polymer binder contained in the polymerizable photosensitive layer according to the invention is not only used as a film-forming agent of the photosensitive layer but also must be soluble in an alkali developing solution. Thus, an organic polymer soluble or swellable in an aqueous alkali solution is ordinarily employed as the polymer binder.

Although various polymers are exemplified as the organic polymers, in the case of intending to perform water development, for example, a water-soluble organic polymer is employed. Examples of such an organic polymer include an addition polymer having a carboxylic acid group in the side chain thereof, for example, polymers described in JP-A-59-44615, JP-B-54-34327, JP-1-58-12577, JP-B-54-25957, JP-A-54-92723, JP-A-59-53836 and JP-A-59-71048. Specific examples thereof include a methacrylic acid copolymer, an acrylic acid copolymer, an itaconic acid copolymer, a crotonic acid copolymer, a maleic acid copolymer and a partially esterified maleic acid copolymer, an acidic cellulose derivative having a carboxylic acid group in the side chain thereof, a polymer obtained by adding a cyclic acid anhydride to an addition polymer having a hydroxy group, polyvinyl pyrrolidone, polyethylene oxide, and an alcohol-soluble polyamide and a polyether of 2,2-bis(4-hydroxyphenyl)propane with epichlorohydrin, both of which is capable of increasing the strength of a cured film formed.

Of these polymers, copolymers of benzyl (meth)acrylate, (meth)acrylic acid and if desired, other addition-polymerizable vinyl monomer and copolymers of allyl (meth)acrylate, (meth)acrylic acid and if desired, other addition-polymerizable vinyl monomer are particularly preferably used.

Further, polyurethane resins as described in JP-B-7-120040, JP-B-7-120041, JP-B-7-120042, JP-B-8-12424, JP-A-63-287944, JP-A-63-287947, JP-A-1-271741 and JP-A-1-352691 are also useful in the invention.

By introducing a radical reactive group into the side chain of the organic polymer, the strength of a cured film formed can be increased. For example, a group having an ethylenically unsaturated bond, an amino group or an epoxy group is illustrated as an addition-polymerizable functional group, a mercapto group, a thiol group, a halogen atom, a triazine structure or an onium salt structure is illustrated as a functional group capable of forming a radical upon irradiation with light, and a carboxy group or an imido group is illustrated as a polar group. Of the addition-polymerizable functional groups, the group having an ethylenically unsaturated bond, for example, an acryl group, a methacryl group, an allyl group or a styryl group is particularly preferred. A functional group selected from an amino group, a hydroxy group, a phosphonic acid group, a phosphoric acid group, a carbamoyl group, an isocyanato group, a ureido group, a ureylene group, a sulfonic acid group and an ammonio group is also useful.

In order to maintain the developing property of the polymerizable photosensitive layer, it is preferred that the polymer binder for use in the invention has an appropriate molecular weight and an acid value. Specifically, the polymer binder having a weight average molecular weight of from 5,000 to 300,000 and an acid value of from 20 to 200 is particularly preferred.

The polymer binder can be contained in an appropriate amount in the polymerizable photosensitive layer. The amount is preferably from 10 to 90% by weight, more preferably from 30 to 80% by weight of the polymerizable photosensitive layer.

A ratio of the compound having an addition-polymerizable ethylenically unsaturated bond to the polymer binder is preferably in a range of from 1/9 to 9/1 by weight, more preferably from 2/8 to 8/2 by weight, and most preferably from 3/7 to 7/3 by weight.

[Other Components]

It is desired to add a small amount of a thermal polymerization inhibitor in addition to the fundamental components described above to the polymerizable photosensitive layer of the polymerizable lithographic printing plate precursor of the invention in order to prevent undesirable thermal polymerization of the compound having an addition-polymerizable ethylenically unsaturated bond during the production and storage of the composition (polymerizable photosensitive layer composition) for the polymerizable photosensitive layer. Suitable examples of the thermal polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis (4-methyl-6-tert-butylphenol), N-nitrosophenylhydroxylamine primary cerium salt and N-nitrosophenylhydroxylamine aluminum salt. The amount of the thermal polymerization inhibitor added is preferably from about 0.01 to about 5% by weight based on the total components of the polymerizable photosensitive layer composition. Further, a higher fatty acid or a derivative thereof, for example, behenic acid or behenic amide may be added to the polymerizable photosensitive layer and localized on the surface of the polymerizable photosensitive layer during a drying process after coating in order to prevent polymerization inhibition due to oxygen, if desired. The amount of the higher fatty acid or derivative thereof added is preferably from about 0.5 to about 10% by weight based on the total components of the polymerizable photosensitive layer composition.

A coloring agent may further be added for the purpose of coloring the polymerizable photosensitive layer. Examples of the coloring agent include a pigment, for example, a phthalocyanine pigment (e.g., C. I. Pigment Blue 15:3, 15:4 or 15:6), an azo pigment, carbon black or titanium oxide, and a dye, for example, Ethyl Violet, Crystal Violet, an azo dye, an anthraquinone dye or a cyanine dye. The amount of the coloring agent added is preferably from about 0.5 to about 5% by weight based on the total components of the polymerizable photosensitive layer composition. In addition, an additive, for example, an inorganic filler or a plasticizer, e.g., dioctyl phthalate, dimethyl phthalate or tricresyl phosphate may be added in order to improve physical properties of the cured film. The amount of such an additive added is preferably not more than 10% by weight based on the total components of the polymerizable photosensitive layer composition. Moreover, a surfactant may be added to the polymerizable photosensitive layer composition in order to improve surface properties of the coating.

The polymerizable photosensitive layer composition is applied to a support to which various surface treatments are applied, if desired, as described hereinafter. When applying the polymerizable photosensitive layer composition to a support, it is dissolved in a variety of organic solvents to use. Examples of the solvent, which can be used, include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol monoethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. The solvents may be used individually or as a mixture of two or more thereof. The concentration of the solid content of the coating solution is suitably from 1 to 50% by weight. A coating amount of the polymerizable photosensitive layer in the polymerizable lithographic printing plate precursor is preferably in a range of from about 0.1 to about 10 $g/m^2$, more preferably from 0.3 to 5 $g/m^2$, and still more preferably from 0.5 to 3 $g/m^2$, in terms of weight after drying.

[Support]

Now, the support, which can be used in the invention, is described below. As the support used in the invention, any support having a hydrophilic surface can be used. The support is preferably a plate-like material having dimensional stability. Examples of the support include paper, paper laminated with plastic (e.g., polyethylene, polypropylene or polystyrene), a plate of metal (e.g., aluminum, zinc or copper) or alloy thereof (e.g., alloy with silicon, copper, manganese, magnesium, chromium, zinc, lead, bismuth or nickel), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal), and paper or a plastic film laminated or deposited with the above-described metal or alloy. Of the supports, an aluminum plate is particularly preferred because the aluminum plate is dimensionally notably stable and inexpensive. A composite sheet comprising a polyethylene terephthalate film having bonded thereon an aluminum sheet as described in JP-B-48-18327 is also preferred. The thickness of support is ordinarily from about 0.05 to about 1 mm.

In the case of using a support having a metal surface, particularly an aluminum surface, it is preferred that the support is subjected to surface treatment, for example, graining treatment, immersion treatment in an aqueous solution, for example, of sodium silicate, potassium fluorozirconate or a phophate, or anodizing treatment, described below.

[Graining Treatment]

A method for the graining treatment used includes a mechanical graining method, a chemical etching method and an electrolytic graining method as described in JP-A-56-28893. Specifically, an electrochemical graining method wherein surface graining is electrochemically conducted in an electrolytic solution of hydrochloric acid or nitric acid, and a mechanical graining method, for example, a wire brush graining method wherein a surface of aluminum plate is scratched with a wire brush, a ball graining method wherein a surface of aluminum plate is grained with abrasive balls and an abrasive or a brush graining method wherein a surface of aluminum plate is grained with a nylon brush and an abrasive may also be employed. The graining methods may be used individually or in combination of two or more thereof. Of these methods, the electrochemical graining method wherein surface graining is electrochemically conducted in an electrolytic solution of hydrochloric acid or nitric acid is preferably used for the formation of grained surface according to the invention. The current density suitable for use is in a range of from 100 to 400 $C/dm^2$. More specifically, it is preferred to perform electrolysis in an electrolytic solution containing from 0.1 to 50% of hydrochloric acid or nitric acid under the conditions of a temperature of from 20 to 100° C., a period of from one second to 30 minutes and a current density of from 100 to 400 $C/dm^2$.

The aluminum support subjected to the surface graining treatment is then chemically etched with an acid or an alkali, The method of using an acid as an etching agent takes time for destroying fine structures and thus, it is disadvantageous to industrially apply the method to the invention. Such disadvantage can be overcome by using an alkali as the etching agent. Examples of the alkali agent preferably used in the invention include sodium hydroxide, sodium carbonate, sodium aluminate, sodium metasilicate, sodium phosphate, potassium hydroxide and lithium hydroxide. Preferred ranges of concentration and temperature are form 1 to 50% and 20 to 100° C., respectively. The alkali etching is preferably performed so that a dissolution amount of aluminum is in a range of from 5 to 20 g/m³. After the etching procedure, the support is subjected to washing with an acid for removing stain (smut) remaining on the surface of support. Examples of the acid for use in the acid-washing step include nitric acid, sulfuric acid, phosphoric acid, chromic acid, hydrofluoric acid and borofluoric acid. In particular, as the method for removing smut after the electrochemical graining treatment, a method of bringing the aluminum support into contact with a 15 to 65% by weight aqueous solution of sulfuric acid having a temperature of from 50 to 90° C. as described in JP-A-53-12739 and a method of performing alkali etching as described in JP-B-48-28123 are preferably exemplified. In the invention, surface roughness (Ra) of the aluminum support is preferably from 0.3 to 0.7 μm.

[Anodizing Treatment]

It is preferred that the aluminum support thus-treated is then subjected to anodizing treatment. The anodizing treatment can be conducted in a manner conventionally used in the field of art. Specifically, it is performed by applying a direct current or alternating current to the aluminum support in an aqueous solution or non-aqueous solution containing sulfuric acid, phosphoric acid, chromic acid, oxalic acid, sulfamic acid, benzenesulfonic acid or a combination of two or more thereof to form an anodic oxide layer on the surface of aluminum support. The conditions of anodizing treatment cannot be determined in a general way, since they are widely varied depending on the electrolytic solution to be used. Ordinarily, however, a concentration of the electrolytic solution is in a range of from 1 to 80%, a temperature of the electrolytic solution is in a range of from 5 to 70° C., a current density is in a range of from 0.5 to 60 A/dm², a voltage is in a range of from 1 to 100 V, and a period of electrolysis is in a range of from 10 to 100 seconds. Of the anodizing treatments, a method of anodizing in a sulfuric acid solution with a high current density as described in British Patent 1,412,768 and a method of anodizing using phosphoric acid as an electrolytic bath as described in U.S. Pat. No. 3,511,661 are preferably used in the invention, the amount of anodic oxide layer is preferably from 1 to 10 g/m², more preferably from 1.5 to 7 g/m², and still more preferably from 2 to 5 g/m².

In the invention, the aluminum support may further be subjected to sealing treatment after the graining treatment and anodizing treatment. The sealing treatment is performed by immersing the aluminum support in hot water or a hot aqueous solution containing an inorganic salt or an organic salt, or transporting the aluminum support in a water vapor bath. Moreover, the aluminum support for use in the invention may be subjected to surface treatment, for example, silicate treatment with an alkali metal silicate or immersion treatment in an aqueous solution, for example, of potassium fluorozirconate or a phosphate.

According to the invention, to a support (in case of using an aluminum support, the aluminum support appropriately subjected to the above-described surface treatments is preferred), a polymerizable photosensitive layer comprising the above-described polymerizable photosensitive layer composition was applied and then a protective layer was applied to prepare a polymerizable lithographic printing plate precursor. Before the application of the polymerizable photosensitive layer, an organic or inorganic subbing layer may be provided on the support, or the support may be subjected to a sol-gel treatment wherein a covalent bond of a functional group capable of generating an addition reaction upon a radical is formed as described in JP-A-7-159983, if desired.

A substance for forming the organic subbing layer includes, for example, a water-soluble resin, e.g., polyvinylphosphonic acid, a polymer or copolymer having a sulfonic acid group on the side chain thereof, polyacrylic acid, a yellow dye and an amine salt. More specifically, examples of the organic compound for use in the organic subbing layer include carboxymethyl cellulose, dextrin, gum arabic, a phosphonic acid having an amino group (for example, 2-aminoethylphosphonic acid), an organic phosphonic acid (for example, phenylphosphonic acid, naphthylphosphonic acid, alkylphosphonic acid, glycerophosphonic acid, methylenediphosphonic acid or ethylenediphosphonic acid, each of which may have a substituent), an organic phosphoric acid (for example, phenylphosphoric acid, naphthylphosphoric acid, alkylphosphoric acid or glycerophosphoric acid, each of which may have a substituent), an organic phosphinic acid (for example, phenylphosphinic acid, naphthylphosphinic acid, alkylphosphinic acid or glycerophosphinic acid, each of which may have a substituent), an amino acid (for example, glycine or β-alanine), and a hydrochloride of an amine containing a hydroxy group (for example, triethanolamine hydrochloride). The organic compounds may be used individually or as a mixture of two or more thereof.

The organic subbing layer can be provided in the following manner. Specifically, the organic compound as described above is dissolved in water, an organic solvent, for example, methanol, ethanol or methyl ethyl ketone, or a mixture thereof, the solution thus prepared is applied to the support and dried to form the organic subbing layer. Alternatively, the organic compound as described above is dissolved in water, an organic solvent, for example, methanol, ethanol or methyl ethyl ketone, or a mixture thereof, and the support is immersed in the solution thus prepared to adsorb the organic compound on the surface of support, then washed, for example, with water and dried to form the organic subbing layer. In the former method, the solution containing the organic compound in concentration of from 0.005 to 10% by weight is coated by means of various methods. Any method, for example, bar coater coating, spin coating, spray coating or curtain coating can be employed. In the latter method, the concentration of the organic compound in the solution is preferably from 0.01 to 20% by weight, and more preferably from 0.05 to 5% by weight. The immersion temperature is preferably from 20 to 90° C., and more preferably from 25 to 50° C. The immersion time is preferably from 0.1 second to 20 minutes, and more preferably from 2 seconds to one minute, The solution of organic compound may be used by adjusting the pH thereof in a range of from 1 to 12 with a basic substance, for example, ammonia, triethylamine or potassium hydroxide, or an acidic substance, for example, hydrochloric acid or phosphoric acid. Further, a yellow dye may be added to the solution in order to improve tone reproducibility of the polymerizable lithographic printing plate precursor. The coating amount of the organic subbing layer after drying is preferably from 2 to 200 mg/m², and more preferably from 5 to 100 mg/m². In such a range of the coating amount, sufficient printing durability is achieved.

A substance for use in the inorganic subbing layer includes an inorganic salt, for example, cobalt acetate, nickel acetate or potassium fluorotitanate. The method for the formation of the inorganic subbing layer is same as that of the organic subbing layer described above.

The polymerizable lithographic printing plate precursor of the invention is directly exposed, for example, with an Ar laser (488 nm, 514.5 nm), a semiconductor laser (from 350 to 1,100 nm, preferably from 350 to 680 nm or from 785 to 1,100 nm, specifically, 405 nm, 630 nm, 650 nm, 680 nm, 785 nm, 830 nm, 860 nm), a YAG laser (1,064 nm, 532 nm (second harmonics), 355 nm (third harmonics), 266 nm (forth harmonics)), and then subjected to development processing. Between the image exposure and the development processing, a heating process at a temperature of from 50 to 150° C. for a period of form 1 second to 5 minutes may be provided for the purpose of enhancing a curing rate of the polymerizable photosensitive layer.

A developing solution for use in the development processing includes a conventionally known aqueous alkali solution containing an alkali agent. Examples of the alkali agent include inorganic alkali agents, for example, sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Further, an organic alkali agent, for example, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine may also be used together. The alkali agents may be used individually or in combination of two or more thereof.

To the developing solution, a surfactant shown below may further be added. Examples of the surfactant include nonionic surfactants, for example, polyoxyethylene alkyl ether (e.g., polyoxyethylene lauryl ether, polyoxyethylene cetyl ether or polyoxyethylene stearyl ether), polyoxyethylene alkyl aryl ether (e.g., polyoxyethylene octyl phenyl ether or polyoxyethylene nonyl phenyl ether), polyoxyethylene alkyl ester (e.g., polyoxyethylene stearate), sorbitan alkyl ester (e.g., sorbitan monolaurate, sorbitan monostearate, sorbitan distearate, sorbitan monooleate, sorbitan sesquioleate or sorbitan trioleate) and monoglyceride alkyl ester (e.g., glycerol monostearate or glycerol monooleate); anionic surfactants, for example, alkylbenzenesulfonate (e.g., sodium dodecylbenzenesulfonate), alkylnaphthalenesulfonate (e.g., sodium butylnaphthalenesulfonate, sodium pentylnaphthalenesulfonate, sodium hexylnaphthalenesulfonate or sodium octylnaphthalenesulfonate), alkylsulfate (e.g., sodium laurylsulfate), alkylsulfonate (e.g., sodium dodecylsulfonate) and sulfosuccinic acid ester salt (e.g., sodium dilaurylsulfosuccinate); and amphoteric surfactants, for example, alkyl betaine (e.g., lauryl betaine or stearyl betaine) and amino acid. Of the surfactants, anionic surfactants, for example, alkylnaphthalenesulfonate, alkyl betaines and nonionic surfactants having a polyoxyalkylene ether group represented by formula (3) described below are particularly preferably used.

$$R^1\text{—}O\text{—}(R^2\text{—}O)_nH \quad (3)$$

In formula (3), $R^1$ represents an alkyl group having from 3 to 15 carbon atoms, which may have a substituent, an aromatic hydrocarbon group having from 6 to 15 carbon atoms, which may have a substituent, or a heteroaromatic ring group having from 4 to 15 carbon atoms, which may have a substituent (examples of the substituent including an alkyl group having from 1 to 20 carbon atoms, a halogen atom, e.g., Br, Cl or I, an aromatic hydrocarbon group having from 6 to 15 carbon atoms, an aralkyl group having from 7 to 17 carbon atoms, an alkoxy group having from 1 to 20 carbon atoms, an alkoxycarbonyl group having from 2 to 20 carbon atoms and an acyl group having from 2 to 15 carbon atoms); $R^2$ represents an alkylene group having from 1 to 10 carbon atoms, which may have a substituent (examples of the substituent including an alkyl group having from 1 to 20 carbon atoms and an aromatic hydrocarbon group having from 6 to 15 carbon atoms); and n represents an integer of from 1 to 100. The part represented by $(R^2\text{—}O)n$ in formula (3) may be formed from two-kind groups or three-kind groups as far as they fulfill the above-described requirements. Specific examples thereof include random or block combinations of ethylene oxy group and propylene oxy group, ethylene oxy group and isopropylene oxy group, ethylene oxy group and butylene oxy group, and ethylene oxy group and isobutylene oxy group.

The surfactants may be used individually or in combination of two or more thereof. The content of the surfactant in the developing solution is preferably from 0.1 to 20% by weight in terms of solid content.

In the invention, the developing solution may further contain other component described below in addition to the above-described components, if desired. Examples of other component include an organic carboxylic acid, for example, benzoic acid, phthalic acid, p-ethylbenzoic acid, p-n-propylbenzoic acid, p-isopropylbenzoic acid, p-n-butylbenzoic acid, p-tert-butylbenzoic acid, p-2-hydroxyethylbenzoic acid, decanoic acid, salicylic acid or 3-hydroxy-2-naphthoic acid, an organic solvent, for example, isopropyl alcohol, benzyl alcohol, ethyl cellosolve, butyl cellosolve, phenyl cellosolve, propylene glycol or diacetone alcohol, a chelating agent, a reducing agent, a dye, a pigment, a water softener, a preservative and a defoaming agent.

The development of the polymerizable lithographic printing plate precursor of the invention with the developing solution is carried out at a temperature of from 0 to 60° C., preferably from 15 to 40° C., in a conventional manner, for example, by immersing the exposed polymerizable lithographic printing plate precursor in the developing solution and rubbing it with a brush. The development processing may also be performed using an automatic developing machine. In such a case, since the developing solution undergoes fatigue according to the processing amount of the polymerizable lithographic printing plate, a replenisher or a fresh developing solution may be used in order to restore the processing capacity. In the polymerizable lithographic printing plate precursor of the invention, the protective layer is provided on the polymerizable photosensitive layer. Removal of the protective layer is conducted together with the removal of the unexposed area of the photosensitive layer with the developing solution. Alternatively, the protective layer is first removed with water or warm water, and then the unexposed area of the photosensitive layer is removed with the developing solution. The water or warm water may contain, for example, a preservative as described in JP-A-10-10754 or an organic solvent as described in JP-A-8-278636.

The polymerizable lithographic printing plate precursor thus developed is then subjected to post-treatment with washing water, a rinse solution containing a surfactant or the like, or a desensitizing solution containing gum arabic, a starch derivative or the like as described, for example, in JP-A-54-8002, JP-A-55-115045 and JP-A-59-58431. For the post-treatment of the polymerizable lithographic printing plate precursor of the invention, these post-treatments may be used in combination. The printing plate thus obtained is subjected to post-exposure treatment by a method as described in JP-A-2000-89478 or heat treatment, for example, baking, whereby its printing durability is improved. The lithographic printing plate thus obtained is then mounted on an offset printing machine to perform printing of a large number of sheets.

The invention will be described in more detail with reference to the following examples, but the invention should not be construed as being limited thereto. Hereinafter, all percents and ratios are by weight unless otherwise indicated.

[Preparation of Polymerizable Photosensitive Lithographic Printing Plate Precursor]

An aluminum plate of 1S having a thickness of 0.30 mm was subjected to surface graining using a nylon brush of No. 8 and an aqueous suspension of pumice stone of 800 mesh and washed thoroughly with water. The plate was etched by immersing in a 10% aqueous sodium hydroxide solution at 70° C. for 60 seconds, washed with running water, and washed with a 20% aqueous nitric acid solution for neutralization, followed by washing with water. The plate was then subjected to electrolytic surface roughening treatment in a 1% aqueous nitric acid solution using an alternating waveform current of sign wave under the condition of $V_A$ of 12.7 V in an amount of electricity of 300 coulomb/dm$^2$ at anode. The surface roughness of the plate was measured to be found 0.45 µm (in Ra). Subsequently, the plate was immersed in a 30% aqueous sulfuric acid solution at 55° C. for 2 minutes to conduct desmutting and then subjected to anodic oxidation in a 20% aqueous sulfuric acid solution at 33° C. at a current density of 5 A/dm$^2$ for 50 seconds while arranging an cathode on the side of the roughened surface of the plate to form an anodic oxide layer having a thickness of 2.7 g/m$^2$.

On the aluminum plate thus-obtained, Subbing layer (1) or Subbing layer (2) was provided in the following manner.

| (Liquid composition for subbing layer 1) | |
|---|---|
| Compound shown below | 0.19 parts by weight |
| Methanol | 550 parts by weight |
| Water | 35 parts by weight |

The coating solution was coated on the above-described aluminum plate by a bar of No. 4 so as to have a dry coating amount of 2 mg/m$^2$ and dried at 100° C. for 10 seconds to form a subbing layer.

On the resulting Subbing layer (1), Polymerizable photosensitive layer composition 1 having the composition shown below was coated so as to have a dry coating amount of 1.4 g/m$^2$ and dried at 95° C. for 50 seconds to form a photosensitive layer.

(Liquid Composition for Subbing Layer 2)

The following sol solution was named Liquid composition for subbing layer 2.

A liquid composition (sol solution) of SG process was prepared in the following manner. The composition shown below was charged in a beaker and stirred at 25° C. for 20 minutes.

| | |
|---|---|
| Si(OC$_2$H$_5$)$_4$ | 38 g |
| 3-Methacryloxypropyltrimethoxysilane | 13 g |
| 85% aqueous phosphoric acid solution | 12 g |
| Ion exchanged water | 15 g |
| Methanol | 100 g |

The solution of the above composition was put into a three-necked flask, a reflux condenser was loaded on the three-necked flask, and the three-necked flask was immersed in an oil bath of room temperature. The temperature of the content of the three-necked flask was raised to 50° C. over 30 minutes while stirring with a magnetic stirrer. The content was further reacted for one hour while maintaining the temperature of oil bath at 50° C. to obtain a liquid composition (sol solution).

The sol solution thus obtained was diluted with a 20/1 (by weight) mixture of methanol and ethylene glycol to a concentration of 0.5% by weight, coated on the above-described aluminum plate by a wheeler, and then dried at 100° C. for 1 minute. The coating amount of the sol solution was 4 mg/m$^2$.

On the resulting Subbing layer (2), Polymerizable photosensitive layer composition 1 having the composition shown below was coated so as to have a dry coating amount of 1.4 g/m$^2$ and dried at 95° C. for 50 seconds to form a photosensitive layer.

(Polymerizable Photosensitive Layer Composition 1)

| | |
|---|---|
| NK Ester A-TMMT (tetramethylolmethane tetraacrylate, manufactured by Shin-Nakamura Chemical Co., Ltd.) | 1.7 parts by weight |
| Binder having the structure shown below (molecular weight: 130,000) | 1.9 parts by weight |
| Sensitizing dye (C1 shown below) | 0.15 parts by weight |
| Polymerization initiator (D1 shown below) | 0.13 parts by weight |
| Sensitizing auxiliary agent (E1 shown below) | 0.53 parts by weight |
| Coloring agent | 1.7 parts by weight |

(dispersion of ε-phthalocyanine (F1 shown below): 15%/ compound shown below (molecular weight: 100,000): 10%/ propylene glycol monomethyl ether acetate: 75%)

| | |
|---|---|
| Fluorine-containing nonionic surfactant (Megafac F176 manufactured by Dainippon Ink & Chemicals, Inc.) | 0.06 parts by weight |
| Polymerization inhibitor | 0.06 parts by weight |

(dispersion of Cupferron AL (manufactured by Wako Pure Chemical Industries, Ltd.) shown below: 10% in plasticizer (TCP): 90%)

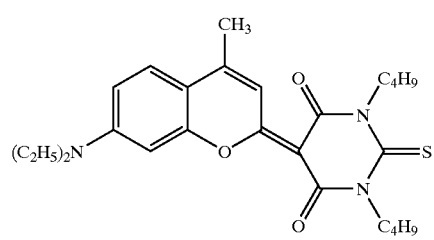

| Solvent: methyl ethyl ketone | 20.0 parts by weight |
| Solvent: propylene glycol monomethyl ethyl acetate | 20.0 parts by weight |

C1

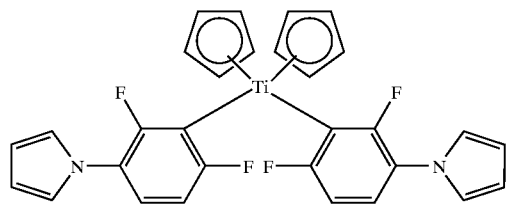

D1

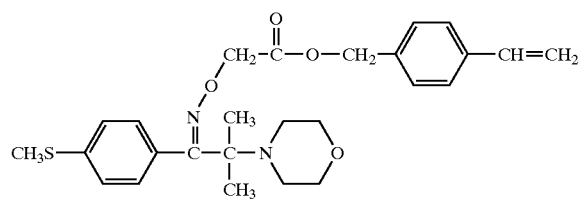

E1

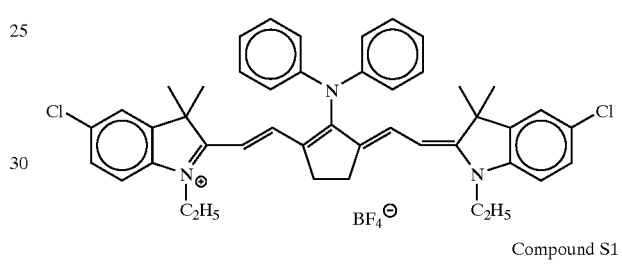

F1

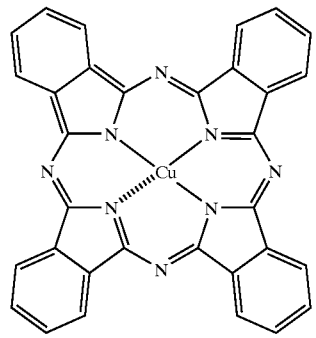

(Polymerizable Photosensitive Layer Composition 2)

Polymerizable photosensitive layer composition 2 was prepared in the same manner as in Polymerizable photosensitive layer composition 1 except for using Dye 1 shown below in place of Sensitizing dye C1 in Polymerizable photosensitive layer composition 1 in order to use for 405 nm violet LD laser.

Dye 1.

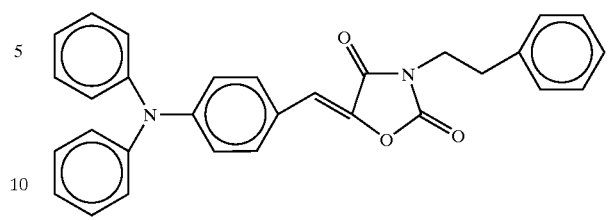

(Polymerizable Photosensitive Layer Composition 3)

Polymerizable photosensitive layer composition 3 was prepared in the same manner as in Polymerizable photosensitive layer composition 1 except for using Dye 2 shown below in place of Sensitizing dye C1 and using Compound S1 shown below in place of Polymerization initiator D1 in Polymerizable photosensitive layer composition 1.

Dye 2

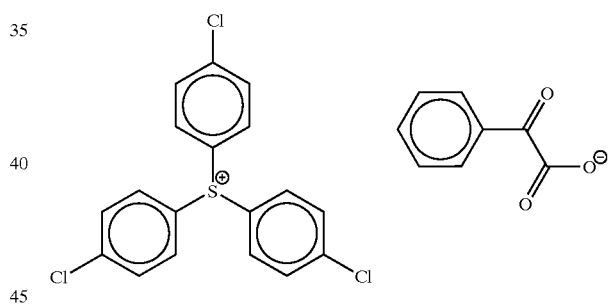

Compound S1

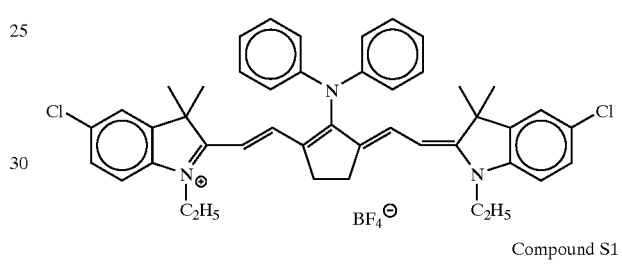

(Polymerizable Photosensitive Layer Composition 4)

Polymerizable photosensitive layer composition 4 was prepared in the same manner as in Polymerizable photosensitive layer composition 1 except for changing the binder to Polyurethane resin B1 shown below and the monomer to Monomer A-1 shown below in Polymerizable photosensitive layer composition 1.

Polyurethane Resin B1:

Polyurethane resin (Mw: 70,000) of condensation polymerization product of the following diisocyanates and diols:

4,4'-Diphenylmethane diisocyanate (MDI)
Hexamethylene diisocyanate (HMDI)
Polypropylene glycol (weight average molecular weight: 1,000) (PPG1000)
2,2-Bis(hydroxymethyl)propionic acid (DMPA)
Tetraethylene glycol (TEG)
(copolymerization molar ratio: MDI/HMDI/PPG1000/DMPA/TEG=40/10/11/26/13)

A-1

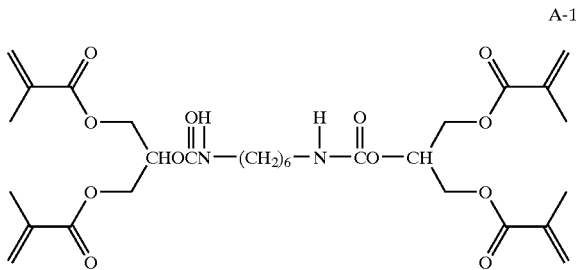

On the photosensitive layer, a solution having the composition shown below was coated as a protective layer so as to have a dry coating amount of 2.5 g/m² and dried at 120° C. for 1 minute and 30 seconds to prepare a polymerizable lithographic printing plate precursor.

(Protective layer composition A)

| | |
|---|---|
| Polyvinyl alcohol (PVA-105, Saponification degree: 98% by mole, polymerization degree: 500, manufactured by Kuraray Co., Ltd.) | 6.0 parts by weight |
| Emalex 710 (surfactant, manufactured by Nihon-Emulsion Co., Ltd.) | 0.1 part by weight |
| Luvitec VA64W (copolymer of vinyl pyrrolidone and vinyl acetate, manufactured by BASF) | 0.4 parts by weight |
| Pionin D-230 (polyoxyethylene castor oil ether, HLB: 11.7, weight average molecular weight: about 3,300, manufactured by Takemoto Oil & Fat Co., Ltd.) | 0.2 parts by weight |
| Water | 100.0 parts by weight |

(Protective layer composition B)

| | |
|---|---|
| Polyvinyl alcohol (PVA-105, Saponification degree: 98% by mole, polymerization degree: 500, manufactured by Kuraray Co., Ltd.) | 6.0 parts by weight |
| Emalex 710 (surfactant, manufactured by Nihon-Emulsion Co., Ltd.) | 0.1 part by weight |
| Luvitec VA64W (copolymer of vinyl pyrrolidone and vinyl acetate, manufactured by BASF) | 0.4 parts by weight |
| Pionin D-236 (polyoxyethylene castor oil ether, HLB: 12.6, weight average molecular weight: about 2,300, manufactured by Takemoto Oil & Fat Co., Ltd.) | 0.2 parts by weight |
| Water | 100.0 parts by weight |

(Protective layer composition C)

| | |
|---|---|
| Polyvinyl alcohol (PVA-105, Saponification degree: 98% by mole, polymerization degree: 500, manufactured by Kuraray Co., Ltd.) | 6.0 parts by weight |
| Emalex 710 (surfactant, manufactured by Nihon-Emulsion Co., Ltd.) | 0.1 part by weight |
| Polyvinyl pyrrolidone (K-30, manufactured by GAF Corp.) | 0.4 parts by weight |
| Pionin D-240-W (polyoxyethylene castor oil ether, HLB: 13.4, weight average molecular weight: about 3,400, manufactured by Takemoto Oil & Fat Co., Ltd.) | 0.2 parts by weight |
| Water | 100.0 parts by weight |

(Protective layer composition D)

| | |
|---|---|
| Polyvinyl alcohol (PVA-105, saponification degree: 98% by mole, polymerization degree: 500, manufactured by Kuraray Co., Ltd.) | 6.0 parts by weight |
| Emalex 710 (surfactant, manufactured by Nihon-Emulsion Co., Ltd.) | 0.1 part by weight |
| Luvitec VA64W (copolymer of vinyl pyrrolidone and vinyl acetate, manufactured by BASF) | 0.4 parts by weight |
| Pionin D-236 (polyoxyethylene castor oil ether, HLB: 12.6, weight average molecular weight: about 2,300, manufactured by Takemoto Oil & Fat Co., Ltd.) | 0.1 part by weight |
| Pionin D-230 (polyoxyethylene castor oil ether, HLB: 11.7, weight average molecular weight: about 3,300, manufactured by Takemoto Oil & Fat Co., Ltd.) | 0.1 part by weight |
| Water | 100.0 parts by weight |

(Protective layer composition E)

| | |
|---|---|
| Polyvinyl alcohol (PVA-105, saponification degree: 98% by mole, polymerization degree: 500, manufactured by Kuraray Co., Ltd.) | 6.0 parts by weight |
| Emalex 710 (surfactant, manufactured by Nihon-Emulsion Co., Ltd.) | 0.1 part by weight |
| Luvitec VA64W (copolymer of vinyl pyrrolidone and vinyl acetate, manufactured by BASF) | 0.4 parts by weight |
| Water | 100.0 parts by weight |

(Protective layer composition F)

| | |
|---|---|
| Polyvinyl alcohol (PVA-105, Saponification degree: 98% by mole, polymerization degree: 500, manufactured by Kuraray Co., Ltd.) | 6.0 parts by weight |
| Emalex 710 (surfactant, manufactured by Nihon-Emulsion Co., Ltd.) | 0.3 parts by weight |
| Luvitec VA64W (copolymer of vinyl pyrrolidone and vinyl acetate, manufactured by BASF) | 0.4 parts by weight |
| Water | 100.0 parts by weight |

EXAMPLES 1 TO 10 AND COMPARATIVE EXAMPLES 1 TO 4

Lithographic printing plate precursors having combinations of layers as shown in Table 1 below were prepared and evaluated in the following manner.

Plate Making Conditions

[Plate size] 80×103 cm

[Exposure environment] A setter and an automatic developing machine described below were placed in a temperature and humidity controlled room capable of keeping the temperature and humidity constant, and evaluations were conducted under three conditions of a temperature of 25° C. and humidity of 25%, 50% or 65%.

[Image for evaluation] A dot image having 2540 dpi and 175 lines/inch and a solid image

[Exposure condition 1] The lithographic printing plate precursor was exposed in an amount of 0.2 mJ/cm² using Luxel Plate Setter P-9600 CTP equipped with an FD-YAG laser (532 nm) (manufactured by Fuji Photo Film Co., Ltd.).

[Exposure condition 2] The lithographic printing plate precursor was exposed in an amount of 90 μJ/cm² using Luxel V9600 CTP equipped with a semiconductor laser (405 nm) (manufactured by Fuji Photo Film Co., Ltd.).

[Exposure condition 3] The lithographic printing plate precursor was exposed in an amount of 100 mJ/cm² using Luxel T-9000 CTP equipped with an infrared semiconductor laser (830 nm) (manufactured by Fuji Photo Film Co., Ltd.).

[Development condition 1] Using an automatic developing machine LP850PII (manufactured by Fuji Photo Film Co., Ltd.), the exposed lithographic printing plate precursor was post-heated in a pre-heating part of the machine so as to make plate surface temperature in the center of a rare surface of the plate at 100° C., and the protective layer of the lithographic printing plate precursor was removed by washing with water of about 23° C. in a pre-water washing bath. Then, the plate precursor was developed at 28° C. for 19 seconds using a developing solution (having pH of 11.95 at 28° C.) prepared by diluting five times a non-silicate type developing solution DV-2 (manufactured by Fuji Photo Film Co., Ltd.) with water in a developing bath. Thereafter, the plate precursor was washed in a water washing bath, subjected to standard treatment with a gum solution prepared by diluting two times finishing gum PF-2W (manufactured by Fuji Photo Film Co., Ltd.) with water in a gumming bath and dried with hot air of 50° C. in a heating part.

[Development condition 2] The condition was the same as Development condition 1 except that the exposed lithographic printing plate precursor was not post-heated in the plate heating part by shutting off the power supply of the heater.

(Evaluation of Polymerizable Lithographic Printing Plate Precursor)

[Removability of Inter Leaf in Setter]

Thirty sheets of the lithographic printing plate precursors were set in the setter and allowed to stand under each of the humidity conditions described above for 24 hours and subjected to the plate making. At that time, a case wherein an inter leaf adhered to the lithographic printing plate precursor and could not be removed was evaluated as "C", and a case wherein 30 sheets of the lithographic printing plate precursors were subjected to the plate making without problem was evaluated as "A".

[Presence of Scratch in Image Area]

The presence of scratch in the solid image area due to scratch formed in the protective layer during transportation of the lithographic printing plate precursor in the setter was examined. A case wherein there was no scratch of image was evaluated as "A", and a case wherein the scratch of image was observed was evaluated as "C".

[Ink Receptivity]

The printing plate obtained by the processing was mounted on a printing machine (R201 Model manufactured by MAN Roland A.G.) and subjected to printing using ink (GEOS G black (N) manufactured by Dainippon Ink & Chemicals. Inc.) for evaluation.

The ink receptivity was evaluated by a number of sheets until ink was sufficiently received on paper at the start of printing. As the number of sheets is smaller, the ink receptivity is better.

The results obtained are shown in Table 1 below. It is apparent from the results that the polymerizable lithographic printing plate precursor exhibits good results even when it is subjected to plate-making under high humidity conditions.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

TABLE 1

| | Subbing Layer | Polymerizable Photosensitive Layer | Protective Layer Composition | Humidity Condition (25° C.) | Exposure Condition | Development Condition | Removability of Inter Leaf | Scratch in Image Area | Ink Receptivity |
|---|---|---|---|---|---|---|---|---|---|
| Example 1 | 1 | 1 | A | 25% RH | 1 | 1 | A | A | 7 |
| | | | | 50% RH | | | A | A | 7 |
| | | | | 65% RH | | | A | A | 7 |
| Comparative Example 1 | 1 | 1 | E | 25% RH | 1 | 1 | A | A | 7 |
| | | | | 50% RH | | | A | A | 7 |
| | | | | 65% RH | | | C | C | 7 |
| Example 2 | 1 | 2 | A | 25% RH | 2 | 1 | A | A | 7 |
| | | | | 50% RH | | | A | A | 7 |
| | | | | 65% RH | | | A | A | 7 |
| Comparative Example 2 | 1 | 2 | E | 25% RH | 2 | 1 | A | A | 7 |
| | | | | 50% RH | | | A | A | 7 |
| | | | | 65% RH | | | C | C | 7 |
| Example 3 | 1 | 3 | A | 25% RH | 3 | 2 | A | A | 8 |
| | | | | 50% RH | | | A | A | 8 |
| | | | | 65% RH | | | A | A | 8 |
| Comparative Example 3 | 1 | 3 | E | 25% RH | 3 | 2 | A | A | 8 |
| | | | | 50% RH | | | A | A | 8 |
| | | | | 65% RH | | | C | C | 8 |
| Example 4 | 1 | 2 | B | 25% RH | 2 | 1 | A | A | 7 |
| | | | | 50% RH | | | A | A | 7 |
| | | | | 65% RH | | | A | A | 7 |
| Example 5 | 1 | 2 | C | 25% RH | 2 | 1 | A | A | 7 |
| | | | | 50% RH | | | A | A | 7 |
| | | | | 65% RH | | | A | A | 7 |
| Example 6 | 1 | 2 | D | 25% RH | 2 | 1 | A | A | 7 |
| | | | | 50% RH | | | A | A | 7 |
| | | | | 65% RH | | | A | A | 7 |
| Example 7 | 2 | 4 | A | 25% RH | 1 | 1 | A | A | −14 |
| | | | | 50% RH | | | A | A | 14 |
| | | | | 65% RH | | | A | A | 14 |
| Example 8 | 2 | 4 | B | 25% RH | 1 | 1 | A | A | −15 |
| | | | | 50% RH | | | A | A | 15 |
| | | | | 65% RH | | | A | A | 15 |

TABLE 1-continued

|  | Subbing Layer | Polymerizable Photosensitive Layer | Protective Layer Composition | Humidity Condition (25° C.) | Exposure Condition | Development Condition | Removability of Inter Leaf | Scratch in Image Area | Ink Receptivity |
|---|---|---|---|---|---|---|---|---|---|
| Example 9 | 1 | 3 | C | 25% RH | 3 | 2 | A | A | 8 |
|  |  |  |  | 50% RH |  |  | A | A | 8 |
|  |  |  |  | 65% RH |  |  | A | A | 8 |
| Example 10 | 1 | 3 | D | 25% RH | 3 | 2 | A | A | 8 |
|  |  |  |  | 50% RH |  |  | A | A | 8 |
|  |  |  |  | 65% RH |  |  | A | A | 8 |
| Comparative Example 4 | 2 | 4 | F | 25% RH | 1 | 1 | A | A | 25 |
|  |  |  |  | 50% RH |  |  | A | A | 25 |
|  |  |  |  | 65% RH |  |  | C | C | 25 |

What is claimed is:

1. A polymerizable lithographic printing plate precursor comprising a support having in order thereon, a polymerizable photosensitive layer and a protective layer containing (A) polyvinyl alcohol and (B) a polyoxyethylene castor oil ether surfactant, wherein the polyoxyethylene castor oil ether surfactant has a hydrophilic-lipophilic balance of from 10.0 to 16.0.

2. The polymerizable lithographic printing plate precursor as claimed in claim 1, wherein the polymerizable photosensitive layer comprises i) a compound having at least one addition-polymerizable ethylenically unsaturated bond, ii) a photopolymerization initiator, and iii) a polymer binder.

3. The polymerizable lithographic printing plate precursor as claimed in claim 2, wherein the polymerizable photosensitive layer further comprises a coloring agent.

4. The polymerizable lithographic printing plate precursor as claimed in claim 2, wherein the polymer binder is an organic polymer soluble or swellable in an aqueous alkali solution.

5. The polymerizable lithographic printing plate precursor as claimed in claim 2, wherein the polymer binder is an organic polymer having a radical reactive group in the side chain thereof.

6. The polymerizable lithographic printing plate precursor as claimed in claim 1, wherein the polyvinyl alcohol in the protective layer has a hydrolysis rate of from 71 to 100% and a polymerization degree of from 300 to 2,400.

7. The polymerizable lithographic printing plate precursor as claimed in claim 1, wherein the protective layer further contains polyvinyl pyrrolidone or a copolymer of vinyl pyrrolidone and vinyl acetate.

8. The polymerizable lithographic printing plate precursor as claimed in claim 1, wherein the protective layer further contains a surfactant other than the polyoxyethylene castor oil ether surfactant.

9. The polymerizable lithographic printing plate precursor as claimed in claim 8, wherein the surfactant other than the polyoxyethylene castor oil ether surfactant is a nonionic surfactant.

10. The polymerizable lithographic printing plate precursor as claimed in claim 1, wherein the polyoxyethylene castor oil ether surfactant has a weight average molecular weight of from 800 to 5,000.

11. A method of plate-making comprising exposing the polymerizable lithographic printing plate precursor as claimed in claim 1 with a laser having a wavelength of from 350 to 1,100 nm and subjecting the exposed printing plate precursor to development processing.

12. The method of plate-making as claimed in claim 11, wherein the laser is a laser having a wavelength of from 350 to 680 nm.

13. The method of plate-making as claimed in claim 11, wherein the laser is an infrared laser having a wavelength of from 785 to 1,100 nm.

* * * * *